United States Patent [19]
Oravetz et al.

[11] Patent Number: 6,021,401
[45] Date of Patent: Feb. 1, 2000

[54] COMPUTER SYSTEM, APPARATUS AND METHOD FOR CALCULATING DEMAND USAGE

[75] Inventors: David M. Oravetz; Ming-Horng Lee, both of Moon Township, Pa.

[73] Assignee: Eaton Corporation, Cleveland, Ohio

[21] Appl. No.: 08/858,228

[22] Filed: May 19, 1997

[51] Int. Cl.$^7$ ........................................ H02J 3/14
[52] U.S. Cl. ................................ 705/412; 702/61; 702/62
[58] Field of Search ........................ 702/61, 62; 307/35, 307/39; 700/291; 705/412

[56] References Cited

U.S. PATENT DOCUMENTS

| | | | |
|---|---|---|---|
| 5,315,531 | 5/1994 | Oravetz et al. | 702/62 |
| 5,414,640 | 5/1995 | Seem | 364/528.26 |
| 5,587,917 | 12/1996 | Elms | 702/66 |
| 5,731,688 | 3/1998 | Thomson | 322/22 |

*Primary Examiner*—James P. Trammell
*Assistant Examiner*—Cuong H. Nguyen
*Attorney, Agent, or Firm*—Martin J. Moran

[57] ABSTRACT

A personal computer (PC) system determines a demand usage value at a predetermined time for a load powered by an electric power system. The computer system includes a database for storing energy usage values and time values; a PC software logging routine for acquiring the values of energy consumed from the electric power system by the load, for determining corresponding time values for times at which the energy was consumed by the load, and for storing the energy usage values and time values in the database; and a PC software calculation routine for retrieving a predetermined count plus one of pairs of those values from the database, with one of the time values corresponding thereto being about equal to the predetermined time. The calculation routine determines a first demand value from a pair of the energy usage values and a pair of the time values corresponding thereto, and also determines at least one second demand value from at least another pair of the energy usage values and at least another pair of the time values corresponding thereto. The calculation routine averages the first demand value with the at least one second demand value to determine the demand usage value which is determined over a time interval about equal to the predetermined count times a predetermined time interval.

22 Claims, 3 Drawing Sheets

COMPUTER SYSTEM, APPARATUS AND METHOD FOR CALCULATING DEMAND USAGE

BACKGROUND OF THE INVENTION

1. Field of the Invention

This invention relates to a computer system, apparatus and method for an electric power system and, more particularly, to a computer system, apparatus and method for calculating electric power parameters such as, for example, power demand.

2. Background Information

Demand charge is one of the most common factors that utility companies employ to determine the total charge to power users (e.g., owners of apartment complexes, industrial power users). Typically, the utility company employs: (1) the peak demand to calculate the power user's demand charge (i.e., $X/kW times the peak demand (kW)), and (2) the total energy consumption to calculate the power user's energy charge (i.e., $0.Y/kWh times the total energy consumed (kWh)). The main electric meter, for example, of the power user may record for the utility company the peak demand, the date and time of the peak demand, and the total energy consumption over the billing period. In some cases, the power user (e.g., the apartment complex owner) wishes to fairly allocate both the demand charge and the energy charge to power sub-users (e.g., the residents of the individual apartments of the apartment complex).

With respect to the allocation of the energy charge, it is known to employ a personal computer (PC) to digitally address a plurality of monitors for power loads over a communications link to gather data generated by the individual monitors for central processing, and to allocate billing for total energy consumed by each of the loads. See, for example, U.S. Pat. No. 5,315,531.

State of the art monitors for alternating current (AC) power systems incorporate microcomputers for calculating various electrical parameters such as RMS currents and voltages, peak currents and voltages, power, energy, power factor and the like. One such monitor is disclosed in U.S. Pat. No. 5,587,917.

Regarding the allocation of the demand charge, it is known to employ PC software to store a history of energy usage for power sub-users in a database.

It is known for a utility company to regularly output a synchronization pulse which defines the beginning of a plurality of periodic time intervals of interest over which the main electric meter determines the peak demand of the power user.

It is also known to employ monitors for AC power systems which receive the synchronization pulse.

The utility company may output a time synchronization pulse on its power grid every day (e.g., at 12:05 AM) to synchronize the electric meters of the power users. By convention, the utility company may predefine a periodic interval (i.e., a demand window) of time (e.g., 15 minutes in length) for the collection and storage of energy usage values (i.e., total accumulated kWh values) associated with the power users. The demand may be defined, for example, to be the average power (kW) over a predefined period of time. The peak demand may be defined, for example, to be the highest demand value, with the time of the peak demand being the end of the time interval in which the peak occurred.

In the example where the time of the peak demand is at the end of the predefined 15-minute interval of time, the PC software stores the energy usage values in the database for each of the power sub-users at the regular 15-minute intervals (e.g., at 12:05 AM, 12:20 AM, 12:35 AM, . . . 11:50 PM) throughout each day. The PC software, which does not receive the daily time synchronization pulse from the power line, employs a real-time clock to define the time and date. Later, after the end of the billing cycle (e.g., a one-month period), the utility company sends the power user an invoice which provides the time of the peak demand (e.g., 4:50 PM on day seventeen of the one-month billing cycle). In turn, the power user's PC software may determine, from the database, the peak demand at the time of the peak demand for each of the power sub-users and employ the power sub-users' peak demands to fairly allocate the demand charge to the power sub-users. The PC software reads the energy usage values at the beginning and at the end of a fixed demand window and computes the demand usage ($kW_{DU}$) as defined by Equation 1:

$$kW_{DU} = \frac{kWh_2 - kWh_1}{t_2 - t_1} \quad \text{(Eq. 1)}$$

wherein:

$kWh_2$ is the energy usage value reading (kWh) at time $t_2$ $kWh_1$ is the energy usage value reading (kWh) at time $t_1$ $(t_2-t_1)$ is the number of hours (e.g., 0.25 hours) of the fixed demand window In other cases, the utility company may not output a time synchronization pulse and, hence, the monitor cannot receive the time synchronization pulse. In those cases, the utility company may define a different starting time and/or a different periodic interval than the time and/or interval employed by the PC software. For example, the utility company may employ a regular 15-minute interval and a time synchronization pulse on its power grid every day at 12:12 AM such that the time of the peak, as defined by the utility company, might occur at 4:42 PM on one day of the billing period. The PC software, which does not have access to the time synchronization pulse, stores the energy usage values at the exemplary regular 15-minute intervals (i.e., at 12:05 AM, 12:20 AM, 12:35 AM, . . . 11:50 PM) as discussed above. In that case, the PC software approximates the demand usage by employing the closest demand window (e.g., 4:20 PM through 4:35 PM) as opposed to the actual desired demand window (e.g., 4:27 PM through 4:42 PM) employed by the utility company.

Accordingly, there is room for improvement in computer systems, apparatus and methods which calculate demand usage.

SUMMARY OF THE INVENTION

The present invention provides significant improvements over the prior art by obviating the need to receive a time synchronization pulse from the utility company, while also improving accuracy in the calculation of the demand usage value. A first demand value is determined from a pair of first values, such as energy usage values of a load, and a pair of second values, such as timestamp values, corresponding to the first values. One or more second demand values are determined from at least another pair of the first values and at least another pair of the corresponding second values. The first demand value and the second demand values are averaged to determine the demand usage value.

The invention is directed to a computer system for determining a demand usage value at a predetermined time for a load powered by an electric power system. The demand usage value is determined over a time interval about equal to a predetermined count times a predetermined time interval. The computer system comprises: memory means for storing a plurality of values; means for acquiring a plurality of first values, which represent energy consumed from the electric power system by the load, and a plurality of second values, which correspond to the first values and which represent times at which the energy was consumed by the load; means for storing the first values and the second values in the memory means; means for retrieving the predetermined count plus one of pairs of the first values and the second values corresponding thereto from the memory means, with one of the second values corresponding thereto being about equal to the predetermined time; means for determining a first demand value from a pair of the first values and a pair of the second values corresponding thereto, and for determining at least one second demand value from at least another pair of the first values and at least another pair of the second values corresponding thereto; and means for averaging the first demand value with the at least one second demand value to determine the demand usage value.

Preferably, the means for determining includes means for determining a difference between a pair of the first values, means for determining a difference between a pair of the second values which correspond to the pair of the first values, and means for determining the ratio of the difference between the pair of the first values and the difference between the pair of the second values.

As another aspect of the invention, an apparatus for determining a demand usage value for a load powered by an electric power system comprises: monitor means for providing a plurality of first values, which represent energy consumed from the electric power system by the load; processor means for determining a plurality of second values, which correspond to the first values and which represent times at which the energy was consumed by the load, and for processing the first values and the second values; and communication means for communicating the first values from the monitor means to the processor means. The processor means comprises: means for repetitively receiving the first values from the communication means, storing means for storing the first values and the second values, and calculating means for calculating the demand usage value from the first values and the second values corresponding thereto stored in the storing means. The calculating means comprises: means for determining a first demand value from a pair of the first values and a pair of the second values corresponding thereto, and for determining at least one second demand value from at least another pair of the first values and at least another pair of the second values corresponding thereto, and means for averaging the first demand value with the at least one second demand value to determine the demand usage value.

The means for repetitively receiving preferably includes means for periodically receiving the first values from the communication means. The storing means preferably includes database means for storing a plurality of pairs each of which includes one of the first values and the second value corresponding thereto.

As a further aspect of the invention, a method determines a plurality of demand usage values and demand charge information for a plurality of loads powered by a utility company. The utility company employs a plurality of first time intervals to determine a peak demand during one of the first time intervals, a time of the peak demand, and a demand charge value for the loads. The demand usage values are determined over a second time interval, which is about equal to the one of the first time intervals and which is about equal to a predetermined count times a second time interval which is shorter than the one of the first time intervals. The method comprises the steps: storing a plurality of first values representing energy consumed from the utility company by each of the loads in a memory; storing a plurality of second values in the memory, with the second values corresponding to the first values and representing times at which the energy was consumed by the loads; finding one of the second values in the memory which is about equal to the time of the peak demand; retrieving the predetermined count plus one of pairs of the first values and the second values corresponding thereto from the memory; determining a first demand value from a pair of the first values and a pair of the second values corresponding thereto; determining at least one second demand value from at least another pair of the first values and at least another pair of the second values corresponding thereto; averaging the first demand value with the at least one second demand value to obtain one of the demand usage values therefrom for one of the loads; repeating the retrieving, determining a first demand value, determining at least one second demand value, and averaging steps for each of the others of the loads; and determining the demand charge information for the loads.

As a preferred refinement, the peak demand and the demand charge value as determined by the utility company are input and a demand charge value for each of the loads is determined from the demand usage values for each of the loads, and the peak demand and the demand charge value as determined by the utility company.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
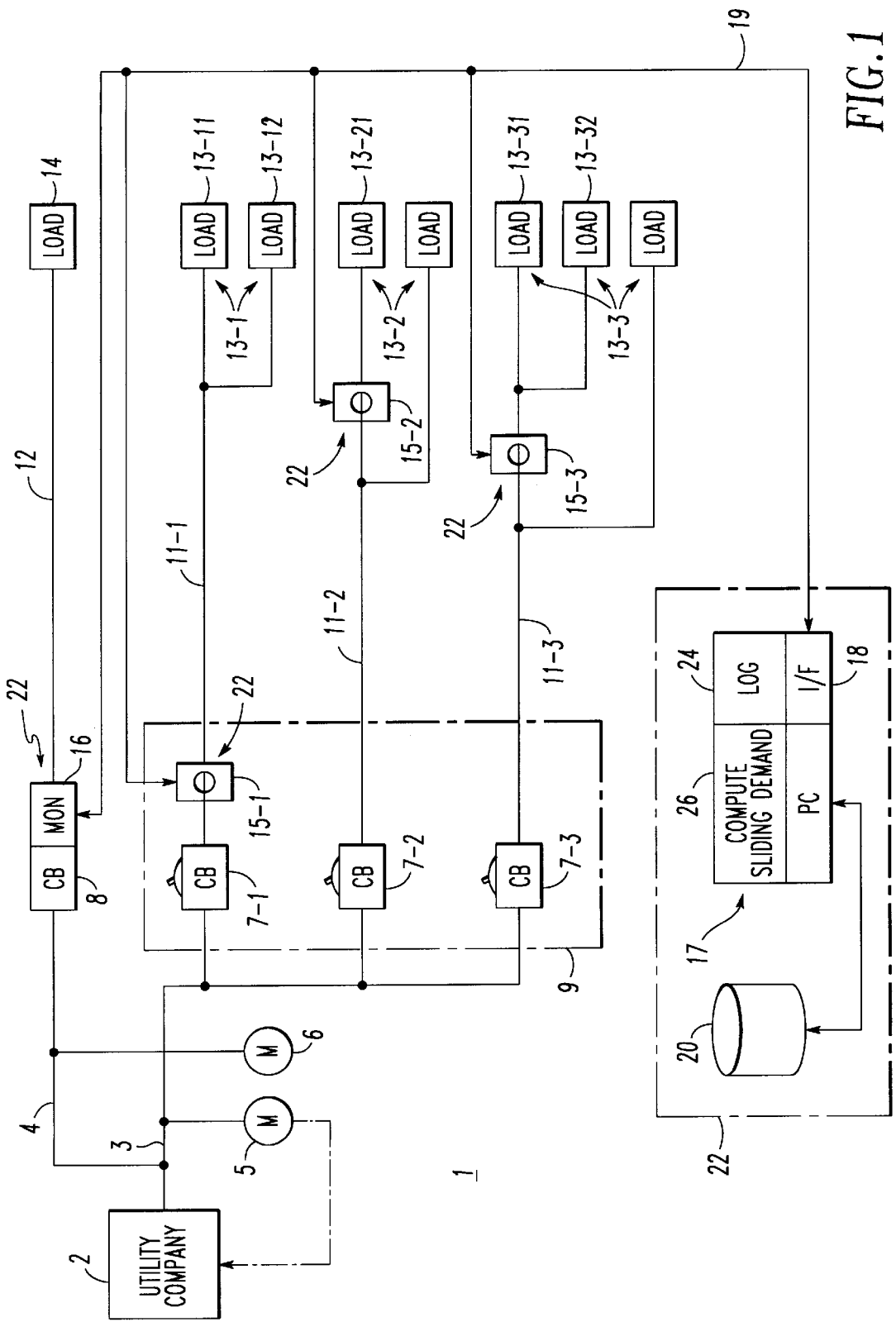
FIG. 1 is a schematic diagram of a computer system for an AC power distribution system in accordance with the invention.

FIG. 1 illustrates an alternating current (AC) power distribution system 1. The AC power distribution system 1 includes main AC lines 3,4 which provide power generated by an electric utility company 2. Meters (M) 5,6 of the utility company 2 are employed on the respective main AC lines 3,4 to measure energy consumed by the distribution system 1. The main AC line 3 is connected to a number of circuit breakers (CB's) 7-1, 7-2, 7-3 mounted in a panel board or load center 9. The circuit breakers 7-1, 7-2, 7-3 provide protection for circuits which include load conductors 1-1, 11-2, 11-3 that provide power to loads 13-1, 13-2, 13-3, respectively. The main AC line 4 is connected to CB 8 which provides protection for a circuit including a load conductor 12 that provides power to load 14.

The exemplary conductors 3, 4, 11-1, 11-2, 11-3, 12 are all represented by a single line for simplicity, although the invention is applicable to multiphase conductors and loads. In order to monitor the energy consumed by individual loads, individual monitoring units 15-1, 15-2, and 15-3 (e.g., a monitor, a monitor/analyzer) are placed on the conductors 11-1, 11-2, and 11-3 for the loads 13-1, 13-21, and 13-31 and 13-32, respectively. Although the exemplary monitoring units 15-1, 15-2, 15-3 are placed anywhere in the distribution system, including anywhere along the conductors 11-1, 11-2, 11-3, the invention is applicable to any type of monitoring unit (e.g., monitoring unit (MON) 16 mounted directly on CB 8 for conductor 12 and load 14). The monitoring unit 15-1 can be placed in the panel board or load center 9 where it monitors energy consumed by all of the loads 13-11 and 13-12 protected by CB 7-1. On the other hand, where the energy consumed by an individual load such as load 13-21 is of interest, the monitoring unit 15-2 can be placed adjacent the load. The monitoring units 15-1, 15-2, 15-3, 16 monitor the current and voltage in the conductor to which they are coupled and calculate power and energy consumed.

As described in U.S. Pat. No. 5,315,531, which is incorporated by reference herein, the individual monitoring units 15-1, 15-2, 15-3, 16 are linked to a central unit, such as represented by the personal computer (PC) 17, through a communications link 19, which in the illustrated embodiment is an INCOM system. The INCOM communications system utilizes a simple two wire synchronous communication line which is daisy chained to the several monitoring units 15-1, 15-2, 15-3, 16 and to a suitable interface (I/F) 18 of the PC 17. The PC 17 digitally addresses each of the monitoring units 15-1, 15-2, 15-3, 16 through I/F 18 in a master-slave relationship for the purpose of gathering the data generated by the individual monitoring units for central processing and allocating appropriate portions of the total billing determined by the meters 5, 6 to the local users. An example of a suitable monitoring unit, such as 15-1 or 16, is disclosed in U.S. Pat. No. 5,587,917, which is incorporated by reference herein.

The meters 5 and 6 employ a series of consecutive time intervals (e.g., 15 minutes in length) to determine a peak demand (kW) during one of those intervals and a time of the peak demand (e.g., day four at 1:23 PM of a billing cycle) for loads 13-1, 13-2, 13-3 powered through load center 9 and load 14 powered through CB 8, respectively. Although the time of the peak demand is preferably the time at the end of a time interval in which the peak demand occurred, other conventions are possible (e.g., at the beginning of the interval, at the middle of the interval, at any predefined time within the interval). As discussed below in connection with FIGS. 2 and 3A–3B, the PC 17 determines demand usage values associated with the loads 13-1, 13-21, 13-31/13-32, 14 over a time interval (e.g., 15 minutes in length) which is about equal to a predetermined count (e.g., 15) times a second time interval (e.g., 1 minute).

Figure 2:
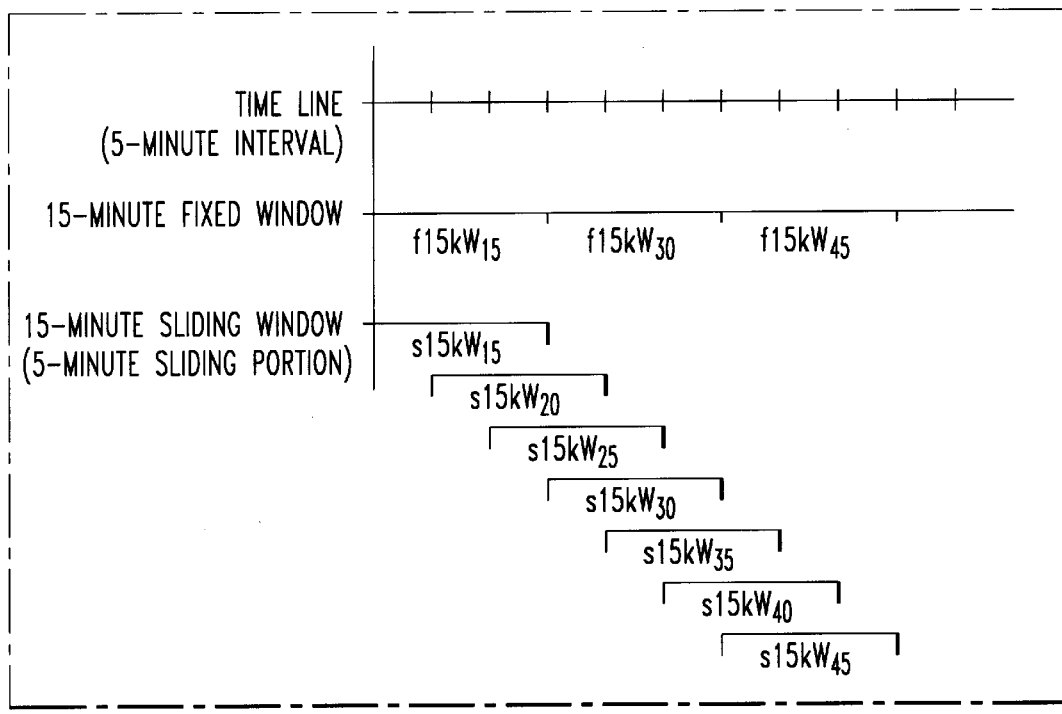
FIG. 2 is a plot of a time line, a series of fixed demand windows, and plural sliding demand windows in accordance with the invention.

As illustrated in FIG. 2, the demand usage defined by a fixed demand window may be computed by modifying Equation 1. For example, if the utility company 2 employs a fixed 15-minute demand window (e.g., f15kW$_{15}$, f15kW$_{30}$, f15kW$_{45}$) and the energy readings of the monitors 15-1, 15-2, 15-3, 16 are saved in exemplary 5-minute sliding portions, then the 15-minute demand usage ending at the "m"th minute is defined by Equation 2:

$$f15kW_m = \frac{(f5kW_{m-10} + f5kW_{m-5} + f5kW_m)}{3} \qquad \text{(Eq. 2)}$$

wherein:
f15kW$_m$ is the fixed 15-minute demand usage (kW) at time t$_m$
f5kW$_{m-10}$ is the 5-minute demand usage (kW) at time t$_{m-10}$
f5kW$_{m-5}$ is the 5-minute demand usage (kW) at time t$_{m-5}$
f5kW$_m$ is the 5-minute demand usage (kW) at time t$_m$ As discussed in greater detail below in connection with FIGS. 3A–3B, the PC 17 employs an exemplary database technique to calculate the demand usage defined by a sliding demand window. By saving the energy usage readings to a database 20 (shown in FIG. 1) and by requesting the energy usage in the interval defined by the appropriate 15-minute sliding demand window (e.g., s15kW$_{15}$, s15kW$_{20}$, s15kW$_{25}$, etc.), sliding demand usage is calculated as defined by Equation 3:

$$s15kW_m = \frac{(f5kW_{m-10} + f5kW_{m-5} + f5kW_m)}{3} \qquad \text{(Eq. 3)}$$

wherein:
s15kW$_m$ is the sliding 15-minute demand usage (kW) at time t$_m$

Referring again to FIG. 1, an exemplary computer system 22 includes the monitors 15-1, 15-2, 15-3, 16, the communications link 19, the PC 17 and the database 20, although any suitable count (e.g., one, two, three or more) or type of monitors or any suitable type of memory (e.g., disk, semiconductor memory) integrated or associated with any suitable processor (e.g., PC, microcomputer, microprocessor, workstation, minicomputer, mainframe computer) for storing plural energy usage readings over a billing cycle may be employed. The system 22 determines a demand usage value at a predetermined time for one or more of the loads 13-1, 13-21, 13-31/13-32, 14 powered by the AC lines 3, 4, although any suitable count of loads or power lines may be employed. The demand usage value is determined over a time interval about equal to a predetermined count (e.g., 15) times a predetermined time interval (e.g., 1 minute), although a wide variety of counts and time intervals are possible.

The monitors 15-1, 15-2, 15-3, 16 acquire the energy usage values, which represent energy consumed from the electric power system by the loads 13-1, 13-21, 13-31/13-32, 14, respectively, and provide those values to the PC 17 over the communications link 19 therebetween. Preferably, the PC 17 is the master and the monitors are the slaves of the communications link 19 which communicates the energy usage values from the monitors to the PC 17. The PC 17 includes a software routine (LOG) 24 for logging energy usage values and corresponding timestamp values to the database 20 and a software routine (COMPUTE SLIDING DEMAND) 26 for computing the sliding demand usage value from energy usage values and timestamp values.

Figure 3A:
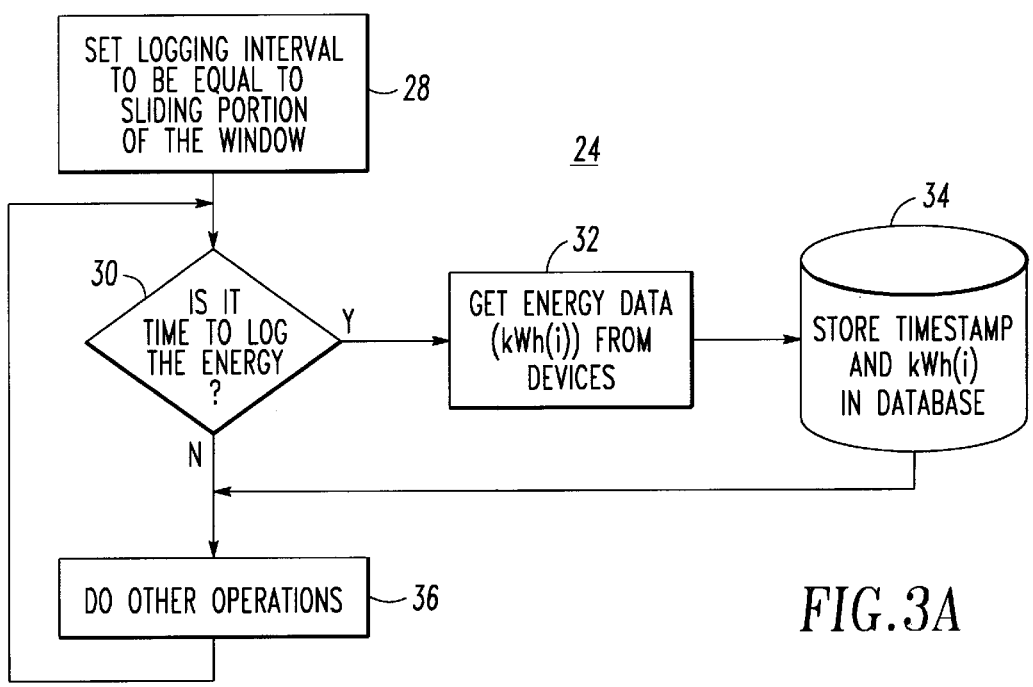
FIG. 3A is a flow chart of a software routine implemented by a personal computer for logging energy usage and time values in accordance with the invention.

As shown in FIG. 3A, at 28, the software routine 24 sets variable Logging Interval to be equal to the desired sliding portion of the sliding demand window. For example, as shown in FIG. 2, this variable is set to 5 minutes. Preferably, in terms of improving the accuracy of the demand usage calculation of FIG. 3B, the variable Logging Interval is set to 1 minute, although a wide range of other values is possible (e.g., less than 1 minute, 2 minutes, 3 minutes, 4 minutes, greater than 5 minutes). At 30, it is determined whether it is time to log the next group of energy usage values from the communications link 19. The PC 17 reads a timer (e.g., a real time clock, or other clock, timer or counter as understood by those skilled in the art) thereof and compares the timer value to the time of the previous logging plus the variable Logging Interval. If the timer value is equal to or greater than the desired logging time, it is time to log. Then, at 32, the PC 17 reads the energy usage values (kWh(i)) from the exemplary monitors 15-1, 15-2, 15-3, 16 by sending suitable requests therefor through I/F 18 and over the communications link 19 and by receiving corresponding responses from such monitors. Next, at 34, the PC 17 stores the energy usage values (kWh(i)) for each of the monitors 15-1, 15-2, 15-3, 16 and a corresponding time variable Timestamp of the timer, as read at 30, in the database 20 of FIG. 1. The time variable Timestamp represents the time at which energy was consumed by the loads 13-1, 13-21, 13-31/13-32, 14 of FIG. 1. At 36, after either 30 or 34, the routine 24 performs other operations before repeating execution of steps 30, 32, 34, 36 at 30. The routine 24 is executed throughout one or more billing cycles to log the time variables (Timestamp) and the energy usage values (kWh(i)) for each billing cycle.

Preferably, at 32 and 34, consecutive groups of the energy usage values (kWh (i)) are repetitively and periodically received from the communications link 19 and such groups, along with the corresponding time variable Timestamp, are repetitively and periodically stored into the database 20, which is ordered by the values of the time variables Timestamp. Also, the database 20 is preferably employed in order that, for any given load and monitor, a pair of the energy usage values (kWh(i)) and a pair of the time variables (Timestamp) corresponding thereto are consecutive ones of the energy usage values (kWh(i)) and consecutive ones of the time variables (Timestamp) corresponding thereto, respectively. For example, for any load "i", the pair of the energy usage values (kWh(i)$_m$ and kWh(i)$_n$) and the pair of the time variables (Timestamp$_m$ and Timestamp$_n$) corresponding thereto are consecutive ones of the energy usage values (kWh(i)) and consecutive ones of the time variables (Timestamp) corresponding thereto as determined at exemplary times m and n (e.g., at 1:23 PM and 1:24 PM), respectively.

Although the exemplary database 20 is employed, it will be appreciated that an array or other suitable data structure of the energy usage values and time variables may be employed in any suitable memory. In the database 20, a database record for one load (i=1) includes an energy usage value (kWh(1)) and a corresponding time variable (Timestamp), and a contemporaneous database record for another load (i=2) includes an energy usage value (kWh(2)) and a corresponding time variable (Timestamp) which has the same value as the time variable corresponding to the other energy usage value (kWh(1)). It will be appreciated that unique time variables (Timestamp(i)) could be applied for each of the energy usage values (kWh(i)).

Figure 3B:
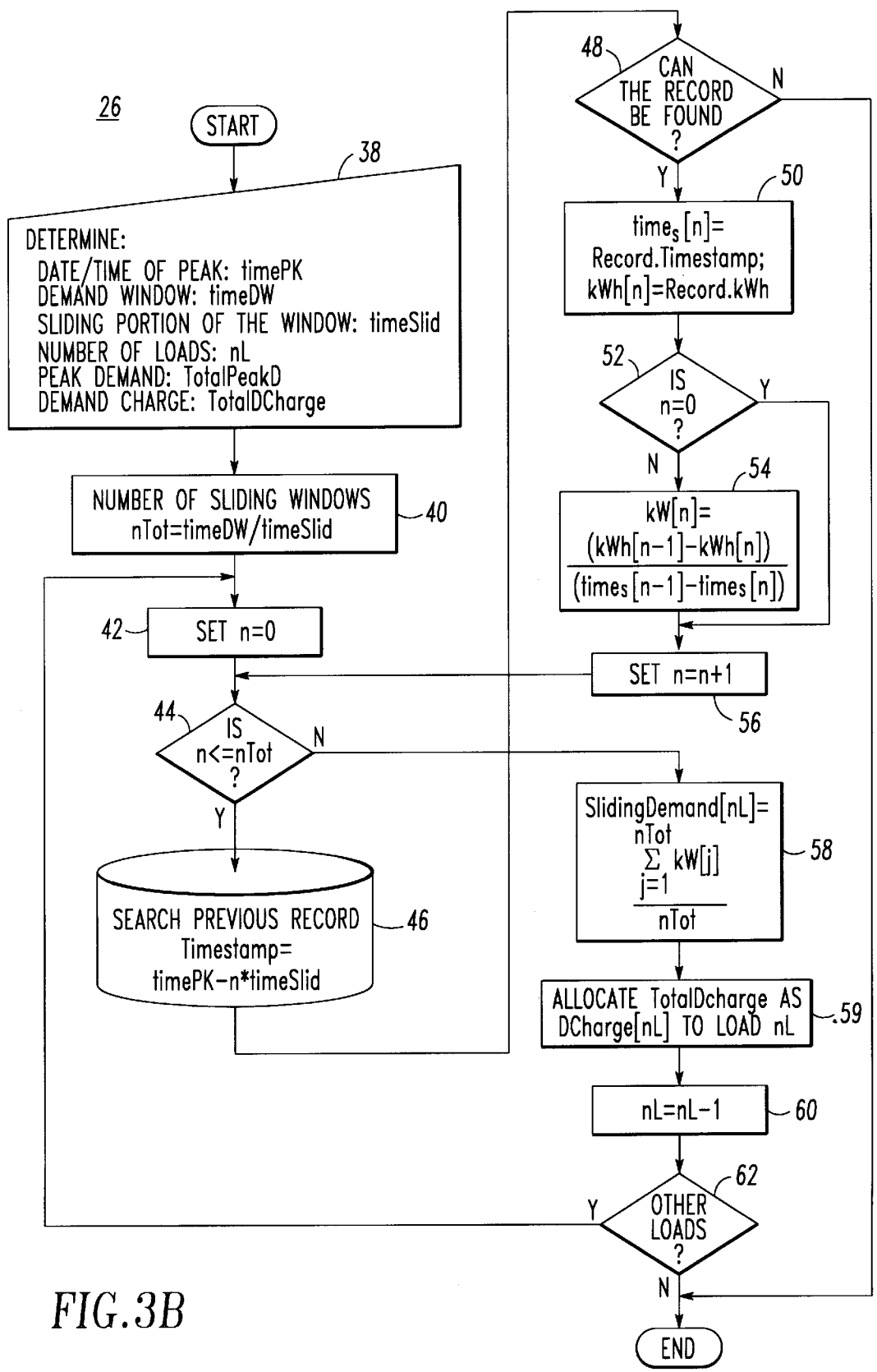
FIG. 3B is a flow chart of a software routine implemented by the personal computer in accordance with the invention.

Referring to FIG. 3B, a flow chart of the software routine 26 is illustrated. This routine 26 is executed following any one of the billing cycles. At 38, variables timePK, timeDW, timeSlid, nL, TotalPeakD, and TotalDcharge are input (e.g., through a suitable user-interface, from PC memory). These variables respectively correspond to the date and time of the peak demand (e.g., as determined by the utility company 2), the size of the demand window (e.g., 15 minutes), the size of the sliding portion of the demand window (e.g., 1 minute), the number of loads of interest, the peak demand (kW) and the demand charge ($). Then, at 40, the number of sliding windows for the demand window, variable nTot (e.g., 15), is determined by dividing the variable timeDW by the variable timeSlid. At 42, a counter n is set to zero. At 44, if counter n is less than or equal to variable nTot, then execution resumes at 46 which searches the database 20 of FIG. 1 to locate a previously stored record including the variable Timestamp equal to timePK−n * timeSlid. If that record is found at 46 as determined at 48, then at 50, variable time$_s$[n] is set to record variable Record.Timestamp from database 20 and variable kWh[n] is set to record variable Record.kWh from database 20, in order that variables time$_s$[n] and kWh[n] contain the time and energy usage value, respectively, stored at the time of interest. On the other hand, if the record is not found at 46, the routine 26 exits. At 52, if counter n is equal to zero, then execution resumes at 56, where counter n is incremented. Otherwise, if counter n is non-zero at 52, then, at 54, a demand value, variable kW[n], is determined from Equation 4:

$$kW[n] = \frac{kWh[n-1] - kWh[n]}{time_s[n-1] - time_s[n]} \qquad (\text{Eq. 4})$$

Following 54, execution resumes at 56 after which 44 is repeated. Steps 44, 46, 48, 50, 52, 54, 56 are repeated until counter n exceeds variable nTot. These steps retrieve a predetermined count (i.e., nTot plus one) of pairs of the time variables (Timestamp) and energy usage values (kWh(i)) corresponding thereto from the database 20, with the first of the time variables (Timestamp) being about equal to the variable timePK (i.e., the date and time of the predetermined peak demand). Each execution of step 54 determines a demand value from a pair of the time variables (Timestamp) and a pair of the energy usage values (kWh(i)) corresponding thereto by: (1) determining a difference (i.e., the energy consumed by the load during the periodic collection time interval) between the pair of the energy usage values (kWh (i)), (2) determining a difference (i.e., the exemplary periodic collection time interval) between the corresponding pair of the time variables (Timestamp), and (3) determining the ratio of those differences. Then, at 58, variable SlidingDemand[nL] (i.e., the demand usage value for load nL) is determined from Equation 5:

$$SlidingDemand[nL] = \frac{\sum (kW[j])}{nTot} \text{ for } j = 1 \ldots nTot \qquad (\text{Eq. 5})$$

Step 58 averages the demand values determined at each of the executions of step 54 and sets the demand usage value equal to that average. Then, at 59, the total demand charge TotalDcharge is allocated to the current load of interest (i.e., load nL) as demand charge Dcharge[nL] determined from Equation 6:

$$Dcharge[nL] = \frac{SlidingDemand[nL]}{TotalPeakD} * TotalDCharge \qquad (\text{Eq. 6})$$

wherein:
Dcharge[nL] is the demand charge ($) for the "nL"th load
SlidingDemand[nL] is the sliding demand (kW) for the "nL"th load from 58
TotalDcharge is the total demand charge ($) for all of the loads from 38
TotalPeakD is the total peak demand (kW) for all of the loads from 38

It will be appreciated that additional monitors may be employed with all of the loads of FIG. 1 in order that the sum of Dcharge[nL] for all of the loads is equal to TotalDcharge for all of the loads. At 60, variable nL is decremented and, at 62, if there are other loads (i.e., nL>0), then step 42 is repeated to determine the variable SlidingDemand for the next load of interest. Otherwise, the routine 26 exits.

In an application, for example, where the utility company 2 employs a regular 15-minute interval and a time synchronization pulse on its power grid every day at 12:12 AM such that the time of the peak, as defined by the utility company 2, might occur at 4:42 PM on one day of the billing period, the exemplary computer system 22 obviates the need to receive the synchronization pulse. The exemplary PC 17 may, for example, store energy usage values at regular 1-minute intervals (i.e., at 12:01 AM, 12:02 AM, 12:03 AM, . . . 11:59 PM, 12:00 midnight). In that case, the PC software routine 26 improves the accuracy in the calculation of the demand usage value by employing essentially the same demand window (e.g., 4:27 PM through 4:42 PM) as the actual desired demand window employed by the utility company 2.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention, which is to be given the full breadth of the claims appended and any and all equivalents thereof.

What is claimed is:

1. A computer system for determining a demand usage value at a predetermined time for a load powered by an electric power system, said demand usage value being determined over a time interval about equal to a predetermined count times a predetermined time interval, said computer system comprising:

memory means for storing a plurality of values;

means for acquiring a plurality of first values, which represent energy consumed from said electric power system by said load, and a plurality of second values, which correspond to the first values and which represent times at which the energy was consumed by said load;

means for storing the first values and the second values in said memory means;

means for retrieving said predetermined count plus one of pairs of the first values and the second values corresponding thereto from said memory means, with one of said second values corresponding thereto being about equal to said predetermined time;

means for determining a first demand value from a pair of the first values and a pair of the second values corresponding thereto, and for determining at least one second demand value from at least another pair of the first values and at least another pair of the second values corresponding thereto; and means for averaging said first demand value with said at least one second demand value to determine said demand usage value.

2. The computer system as recited in claim 1 wherein said means for determining includes:

means for determining a difference between a pair of the first values;

means for determining a difference between a pair of the second values which correspond to said pair of the first values of said means for determining a difference between a pair of the first values; and means for determining the ratio of said difference between the pair of the first values and said difference between the pair of the second values.

3. The computer system as recited in claim 2 wherein said pair of the first values of said means for determining a difference between a pair of the first values and said pair of the second values of said means for determining a difference between a pair of the second values are consecutive ones of the first values and consecutive ones of the second values which correspond thereto, respectively.

4. The computer system as recited in claim 2 wherein said difference between a pair of the second values is about equal to said predetermined time interval.

5. An apparatus for determining a demand usage value for a load powered by an electric power system, said apparatus comprising:

monitor means for providing a plurality of first values, which represent energy consumed from said electric power system by said load;

processor means for determining a plurality of second values, which correspond to the first values and which represent times at which the energy was consumed by said load, and for processing the first values and the second values; and communication means for communicating the first values from said monitor means to said processor means, with said processor means comprising:
      means for repetitively receiving the first values from said communication means,
      storing means for storing the first values and the second values, and
      calculating means for calculating said demand usage value from the first values and the second values corresponding thereto stored in said storing means, with said calculating means comprising:
         means for determining a first demand value from a pair of the first values and a pair of the second values corresponding thereto, and for determining at least one second demand value from at least another pair of the first values and at least another pair of the second values corresponding thereto, and
         means for averaging said first demand value with said at least one second demand value to determine said demand usage value.

6. The apparatus as recited in claim 5 wherein said means for repetitively receiving includes means for periodically receiving the first values from said communication means.

7. The apparatus as recited in claim 6 wherein said at least another pair of the first values and said at least another pair of the second values corresponding thereto are another two pairs of the first values and another two pairs of the second values corresponding thereto, respectively; wherein a first pair of one of the first values and the second value corresponding thereto is followed by a second pair of another one of the first values and the second value corresponding thereto after about a predetermined interval of time; wherein said second pair is followed by a third pair of another one of the first values and the second value corresponding thereto after about the predetermined interval of time; wherein said means for determining includes means for determining the first demand value from said first and second pairs and means for determining the second demand value from said second and third pairs; and wherein said means for averaging includes means for determining the demand usage value from said first, second and third pairs.

8. The apparatus as recited in claim 6 wherein a pair of one of the first values and the second value corresponding thereto is followed by a subsequent pair of another one of the first values and the second value corresponding thereto after about a predetermined interval of time; wherein said means for determining includes means for determining at least three demand values from at least four consecutive pairs of one of the first values and the second value corresponding thereto; and wherein said means for averaging includes means for determining the demand usage value from said at least three demand values.

9. The apparatus as recited in claim 5 wherein said storing means includes database means for storing a plurality of pairs of values; and wherein each of said pairs of values includes one of the first values and the second value corresponding thereto.

10. The apparatus as recited in claim 5 wherein said at least one second demand value is a second demand value.

11. The apparatus as recited in claim 5 wherein said at least one second demand value is a plurality of second demand values.

12. The apparatus as recited in claim 5 wherein said means for determining includes:
   means for determining a difference between a pair of the first values;
   means for determining a difference between a pair of the second values which correspond to said pair of the first values of said means for determining a difference between a pair of the first values; and
   means for determining the ratio of said difference between the pair of the first values and said difference between the pair of the second values.

13. The apparatus as recited in claim 5 wherein said pair of the first values and said pair of the second values corresponding to said pair of the first values are consecutive ones of the first values and consecutive ones of the second values corresponding thereto, respectively.

14. The apparatus as recited in claim 5 wherein said monitor means is a monitor.

15. The apparatus as recited in claim 5 wherein said monitor means is a monitor/analyzer.

16. The apparatus as recited in claim 5 wherein said processor means includes a personal computer.

17. The apparatus as recited in claim 5 wherein said communication means is a communications link between said processor means and said monitor means.

18. The apparatus as recited in claim 17 wherein said processor means is a master of the communications link and said monitor means is a slave of said communications link.

19. A method for determining a plurality of demand usage values and demand charge information for a plurality of loads powered by a utility company, the utility company employing a plurality of first time intervals to determine a peak demand during one of the first time intervals, a time of the peak demand, and a demand charge value for said loads, said demand usage values being determined over a second time interval, which is about equal to said one of the first time intervals and which is about equal to a predetermined count times a second time interval which is shorter than said one of the first time intervals, said method comprising the steps:

storing a plurality of first values representing energy consumed from said utility company by each of said loads in a memory;

storing a plurality of second values in the memory, with the second values corresponding to the first values and representing times at which the energy was consumed by said loads;

finding one of the second values in said memory which is about equal to said time of the peak demand;

retrieving said predetermined count plus one of pairs of the first values and the second values corresponding thereto from said memory;

determining a first demand value from a pair of the first values and a pair of the second values corresponding thereto;

determining at least one second demand value from at least another pair of the first values and at least another pair of the second values corresponding thereto;

averaging said first demand value with said at least one second demand value to obtain one of said demand usage values therefrom for one of said loads;

repeating said retrieving, said determining a first demand value, said determining at least one second demand value, and said averaging steps for each of the others of said loads; and determining said demand charge information for the loads.

20. The method as recited in claim 19 including the steps:
determining a difference between a pair of the first values;
determining a difference between a pair of the second values corresponding to said pair of the first values; and
determining one of the first and second demand values from the ratio of said difference between a pair of the first values and said difference between a pair of the second values corresponding to said pair of the first values.

21. The method as recited in claim 19 including the steps:
inputting the peak demand and the demand charge value as determined by the utility company; and
determining a demand charge value for each of the loads from the demand usage values for each of the loads, and the peak demand and the demand charge value as determined by the utility company.

22. The method as recited in claim 19 including the steps:
employing a pair of one of the first values and the second value corresponding thereto;
following said pair of one of the first values and the second value corresponding thereto by a subsequent pair of another one of the first values and the second value corresponding thereto after about a predetermined interval of time;
determining at least three demand values from at least four consecutive pairs of one of the first values and the second value corresponding thereto; and
determining the demand usage value from said at least three demand values.

* * * * *